US012085603B2

(12) United States Patent
Yin et al.

(10) Patent No.: US 12,085,603 B2
(45) Date of Patent: Sep. 10, 2024

(54) NOISE MONITORING APPARATUS, NOISE MONITORING SYSTEM AND A NOISE MONITORING METHOD

(71) Applicant: Taiwan Semiconductor Manufacturing Company, Ltd., Hsinchu (TW)

(72) Inventors: Chin Yin, Tainan (TW); Chih-Lin Lee, Miaoli County (TW); Kuo-Yu Chou, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 290 days.

(21) Appl. No.: 17/879,752

(22) Filed: Aug. 2, 2022

(65) Prior Publication Data
US 2024/0044969 A1    Feb. 8, 2024

(51) Int. Cl.
*G01R 31/26* (2020.01)
(52) U.S. Cl.
CPC ..... *G01R 31/2646* (2013.01); *G01R 31/2607* (2013.01)
(58) Field of Classification Search
CPC .................. G01R 31/2646; G01R 31/2607

USPC .... 324/613, 314, 620, 760.02, 762.08–762.1
See application file for complete search history.

(56) References Cited

U.S. PATENT DOCUMENTS 6,678,187 B2 *  1/2004  Sugibayashi ....... G11C 11/1673
                                                    365/158

* cited by examiner

*Primary Examiner* — Eman A Alkafawi
*Assistant Examiner* — Rahul Maini
(74) *Attorney, Agent, or Firm* — JCIPRNET

(57) ABSTRACT

A noise monitoring apparatus includes a row selection circuit, a direct current (DC) cancellation circuit and an amplifier circuit. The row selection circuit selects a row of a DUT array to be a selected row during a readout period, wherein the selected row comprises a plurality of selected DUTs. The DC cancellation circuit is coupled to unselected DUTs of the DUT array during the readout period, generates a DC current signal based on bias current signals from a group of unselected DUTs and subtract the DC current signal from a first noise signal of the selected DUT to generate a second noise signal. The amplifier circuit is coupled to the plurality of selected DUTs of the selected row during the readout period, and amplifies the second noise signal from each of the selected DUTs to generate an output signal.

20 Claims, 5 Drawing Sheets

NOISE MONITORING APPARATUS, NOISE MONITORING SYSTEM AND A NOISE MONITORING METHOD

BACKGROUND

Random telegraph noise (RTN) is a certain type of noise occurring in semiconductor devices. The RTN may be monitored by using a standalone noise measurement system, in which each device-under-test (DUT) is monitored individually. However, this monitoring technique suffers from long time cost per DUT, limited total quantity of DUTs to be tested, and limited distribution of noise figure-of-merit (FoM). RTN may also be monitored using a source-follower (SF) circuit structure. However, this RTN monitoring technique suffers from limited dynamic range and limited bias control.

It is desirable for a creative design of a noise monitoring apparatus that is capable of monitoring noise from a plurality of DUTs in parallel with a wide dynamic range and a full-bias control.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DESCRIPTION OF THE EMBODIMENTS

Figure 1:
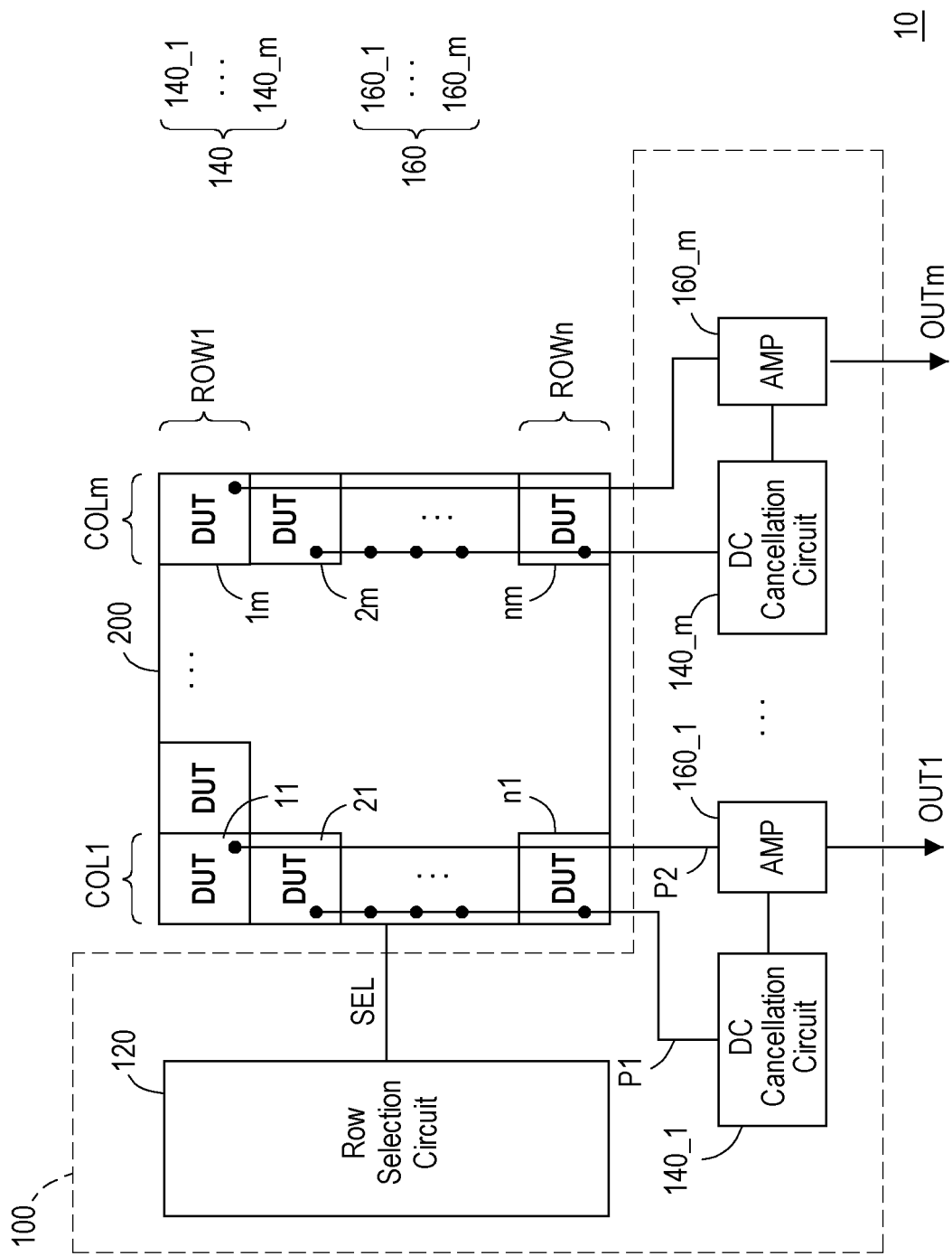
FIG. 1 illustrates a schematic diagram of a noise monitoring system in accordance with some embodiments.

The following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 illustrates a schematic diagram of a noise monitoring system 10 in accordance with some embodiments. The noise monitoring system 10 may include a noise monitoring apparatus 100 and a device-under-test (DUT) array 200. The DUT array 200 may include a plurality of DUTs being arranged in rows ROW1 to ROWn and columns COL1 to COLm, in which m and n are positive integers. Each of the rows ROW1 to ROWn may include a plurality of DUTs. For example, the row ROW1 includes DUT 11 to DUT 1m, and the row ROWn includes DUT n1 to DUT nm. The noise signals from the DUTs of the same row may be monitored simultaneously in a same readout period. For example, the noise signals from the DUT 11 to DUT 1m of the row ROW1 are monitored simultaneously in a same first readout period, and the noise signals from the DUT n1 to DUT nm of the ROWm are monitored simultaneously in a same second readout period. In some embodiments, each DUT of the DUT array 220 may include a transistor, but the disclosure is not limited thereto.

The noise monitoring apparatus 100 may include a row selection circuit 120, a direct current (DC) cancellation circuit 140 and an amplifier circuit 160. The row selection circuit 120 is coupled to the DUT array 200 and is configured to generate a selection signal SEL to select a row among the rows ROW1 to ROWn of the DUT array 200. The row selection circuit 120 may select one of the rows ROW1 to ROWn for noise monitoring in each readout period. For example, the row selection circuit 120 may select the row ROW1 of the DUT array 200 in the first readout period, and the row selection circuit 120 may select the second row ROWm of the DUT array 200 in the second readout period. The row selection circuit 120 may sequentially or randomly select the rows ROW1 to ROWn of the DUT array 200 for noise monitoring. In each readout period, the row that is selected by the row selection circuit 120 is referred to as a selected row, and the remaining rows of the DUT array 200 are referred to as unselected rows. In addition, the DUTs of the selected row are referred to as selected DUTs, and the DUTs of the unselected rows are referred to as unselected DUTs. For example, when the row selection circuit 120 selects the row ROW1 as the selected row, the DUTs of the selected row ROW1 are selected DUTs, and the DUTs of the unselected rows ROW2 to ROWn are unselected DUTs. In some embodiments, the noise to be monitored from the DUTs of the DUT array 200 is random telegraph noise (RTN).

The DC cancellation circuit 140 may include a plurality of column DC cancellation circuits 140_1 to 140_m corresponding to the columns COL1 to COLm of the DUT array 200. For example, the column DC cancellation circuit 140_1 corresponds to the column COL1 of the DUT array 200, and the column DC cancellation circuit 140_m corresponds to the column COLm of the DUT array 200. In some embodiments, each of the column DC cancellation circuits 140_1 to 140_m is electrically coupled to unselected DUTs of the corresponding one of the columns COL1 to COLm (i.e., a group of unselected DUTs). For example, when the row ROW1 is the selected row, the column DC cancellation circuit 140_1 is electrically coupled to the unselected DUTs 21 to n1 of the corresponding column COL1 via an electrical path P1, and the column DC cancellation circuit 140_m is electrically coupled to the unselected DUTs 2m to nm of the corresponding column COLm.

The amplifier circuit 160 may include a plurality of column amplifier circuits 160_1 to 160_m corresponding to the columns COL1 to COLm of the DUT array 200. For example, the column amplifier circuit 160_1 corresponds to the column COL1 of the DUT array 200, and the column amplifier circuit 160_m corresponds to the column COLm of the DUT array 200. In some embodiments, each of the column amplifier circuits 160_1 to 160_m is electrically coupled to the selected DUT of the corresponding one of the columns COL1 to COLm during a readout period. For example, the during a readout period of the row ROW1 (i.e., the row ROW1 is the selected row), the column amplifier circuit 160_1 is electrically coupled to the selected DUT 11 of the corresponding column COL1 via an electrical path P2, and the column amplifier circuit 160_m is electrically coupled to the selected DUT 1m of the corresponding column COLm. In this way, the noise signals from the DUTs of the selected row may be monitored simultaneously in the same readout period.

In some embodiments, each of the column DC cancellation circuits 140_1 to 140_m is configured to generate a DC current signal based on bias current signals from unselected DUTs of the corresponding column. For example, the column DC cancellation circuit 140_1 may generate the DC current signal based on the bias current signals from unselected DUTs 21 to n1 of the corresponding column C1, and the column DC cancellation circuit 140_m may generate the DC current signal based on the bias current signals from unselected DUTs 2m to nm of the corresponding column Cm. The DC current signal generated by each of the column DC cancellation circuits 140_1 to 140_m is used to cancel a DC component of a noise signal from the selected DUT. For example, when the row ROW1 is the selected row, the DC current signal generated by the column DC cancellation circuit 140_1 is used to cancel the DC component of the noise signal from the selected DUT 11, and the DC current signal generated by the column DC cancellation circuit 140_m is used to cancel the DC component of noise signal from the selected DUT 1m. After the DC component is canceled from the noise signals from the selected DUTs of the selected row, the noise signals are amplified by the column amplifier circuits 160_1 to 160_m to generate output signals OUT1 to OUTm. The output signals OUT1 to OUTm represent the noise signals (i.e., RTN signals) from the selected DUTs of the selected row.

Figure 2A:
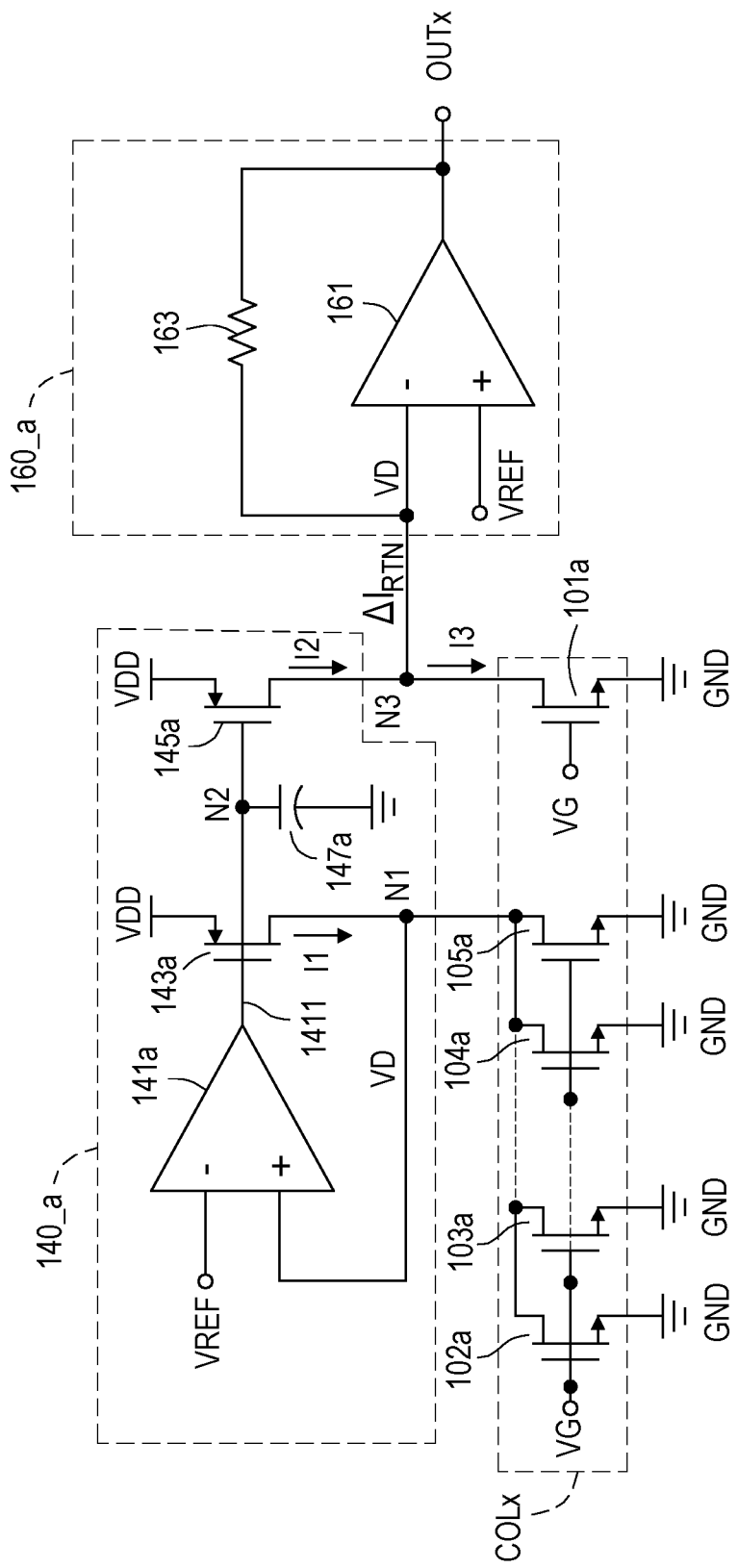
FIG. 2A and FIG. 2B illustrate schematic diagrams of a column of DUTs, a column DC cancellation circuit and a column amplifier circuit of a noise monitoring system in accordance with some embodiments.

FIG. 2A illustrates a schematic diagram of a column of DUTs COLx, a column DC cancellation circuit 140_a and a column amplifier circuit 160_a in accordance with some embodiments. The column COLx of DUTs may be any one of the columns COL1 to COLm of the DUT array 200 in FIG. 1, and the column DC cancellation circuit 140_a and the column amplifier circuit 160_a correspond to the column COLx.

The column COLx may include a plurality of DUTs 101a to 105a, in which the DUT 101a is the selected DUT and the DUTs 102a to 105a are unselected DUTs. In some embodiments, each of the DUTs of the column COLx includes a n-type transistor. In some embodiments, the selected DUT 101a includes a control terminal, a first terminal and a second terminal, in which the control terminal of the selected DUT 101a is biased by a bias voltage VG, the first terminal of the selected DUT 101a is electrically coupled to the column amplifier circuit 160_a via a connection node N3, and the second terminal of the selected DUT 101a receives a supply voltage (i.e., ground voltage) GND. Referring to FIG. 1 and FIG. 2A, the bias voltage VG may be outputted by the row selection circuit 120 or any other circuitry of the noise monitoring system 10. In some embodiments, the control terminal each of the unselected DUTs 102a to 105a is biased by the bias voltage VG, the first terminal of each of the unselected DUTs 102a to 105a is electrically coupled to the column DC cancellation circuit 140_a, and the second terminal of each of the unselected DUTs 102a to 105a receives a supply voltage (i.e., ground voltage GND). The first terminal of each of the unselected DUTs 102a to 105a may be coupled to the column DC cancellation circuit 140_a via the connection node N1.

When the bias voltage VG is applied to the control terminals of the unselected DUTs 102a to 150a, each unselected DUTs 102a to 150a may generate a bias current signal. Since the first terminals of the unselected DUTs 102a to 150a are electrically coupled to connection node N1, a current I1 flowing through the connection node N1 may be equivalent to a sum of the bias current signals from the unselected DUTs 102a to 150a.

In some embodiments, the column DC cancellation circuit 140_a includes an amplifier 141a, transistors 143a, 145a and a capacitor 147a. The amplifier 141a may include a first input terminal, a second input terminal and an output terminal. The first input terminal of the amplifier 141a is electrically coupled to the connection node N1, the second input terminal of the amplifier 141a receives a reference voltage VREF, and the output terminal of the amplifier 141a is coupled to the control terminal of the transistor 143a. In some embodiments, the amplifier 141a is configured to amplify a difference between a voltage VD at the first input terminal and the reference voltage VREF at the second input terminal. The amplifier 141a outputs a signal 1411 at the output terminal of the amplifier 141a, and the signal 1411 is provided to the control terminal of the transistor 143a to drive the transistor 143a. The signal 1411 may force the control terminal of the transistor 143a to a required voltage such that the voltage VD at the connection node N1 has the same voltage level as the reference voltage VREF. In other words, the amplifier 141a and the transistor 143a may lock the voltage level of the VD to be same as the voltage level of the reference voltage VREF.

In some embodiments, one terminal of the transistor 143a is coupled to the connection node N1, and another terminal of the transistor 143a receives a supply voltage VDD. The control terminal of the transistor 143a may be coupled to the control terminal of the transistor 145a via a connection node N2. In addition, one terminal of the transistor 145a is coupled to the connection node N3, and another terminal of the transistor 145a receives the supply voltage VDD. The transistors 143a and 145a are configured to generate a current signal I2 according to the current signal I1 and a mirror ratio R. The mirror ratio R may be determined according to a number of DUTs in each column of the DUT array (or a number of rows of the DUT array). For example, the mirror ratio may be $$R = \frac{n-1}{1},$$

in which n is the number of DUTs in each column of the DUT array 200. In some embodiments, a channel width of the transistor 145a is different from a channel width of the transistor 143a. For example, a ratio of the channel width of the transistor 143a and the channel width of the transistor 145a may be substantially same as the mirror ratio R, but the disclosure is not limited thereto. In some embodiments, a ratio of the current signal I1 over the current signal I2 is equal to the mirror ratio R. In some embodiments, the transistors 143a and 145a have comparably large dimension sizes (i.e., width and/or length). The transistors 143a and 145a with large dimension sizes may eliminate any possibility of RTN noise and flicker noise source happened in the DC cancellation circuit 140_a. In some embodiments, the transistors 143a and 145a are n-type transistors.

In some embodiments, one terminal of the capacitor 157a is coupled to the connection node N2, and another terminal of the capacitor 157a receives the ground voltage GND. The capacitor 157a may function as a low-pass filter (LPF) that filters out high-frequency component of the current signal I1 flowing through the connection node N2 to generate the current signal I2. In this way, the column DC cancellation circuit 140_a may perform the DC cancellation by subtracting the current signal I2 from a first noise signal I3 that is obtained from the selected DUT 101a.

In some embodiments, since the current signal I1 is equivalent to the sum of the bias current signals from the unselected DUTs 102a to 105b, and the current signal I2 is the mirrored current of the current signal I1 in the ratio of $$\frac{n-1}{1},$$

the current signal I2 may be equivalent to an average of the bias current signals from the unselected DUTs 102a to 105a. In other words, the column DC cancellation circuit 140_a may average out the bias current signals from the unselected DUTs 102a to 105b to generate the current signal I2. In this way, random device mismatches of the unselected DUTs 102a to 105b are averaged out, and the RTN from individual unselected DUTs may be eliminated.

In some embodiments, when the bias voltage VG is asserted to the control terminal of the selected DUT 101a, a first noise signal I3 is generated. At the connection node N3, the current signal I2 is subtracted from the first noise signal I3 to generate a second noise signal $\Delta I_{RTN}$. In other words, the DC cancelation is performed on the first noise signal I3 to generate the second noise signal $\Delta I_{RTN}$. In some embodiments, the first noise signal I3 is a current signal, and the second noise signal is referred to as a current differential signal. The second noise signal $\Delta I_{RTN}$ is inputted to the column amplifier circuit 160_a.

The column amplifier circuit 160_a may include an amplifier 161 and a resistor 163. The resistor 163 may be a variable resistor, in which a resistance of resistor 163 may positively proportional to an amplification gain of the column amplifier circuit 160_a. The amplifier 161 may include a first input terminal and a second input terminal, in which the first input terminal receives the reference voltage VREF, and the second input terminal receives the second noise signal $\Delta I_{RTN}$. The resistor 163 may be coupled between the second input terminal of the amplifier 161 and the output terminal of the amplifier 161. In some embodiments, the column amplifier circuit 160_a is a transimpedance amplifier may convert and amplify the second noise signal $\Delta I_{RTN}$ according to the amplification gain to generate an output voltage (also referred to as an output signal) OUTx. The output signal OUTx may represents the RTN signal from the selected DUT 101a.

In some embodiments, the column amplifier circuit 160_a operates in a manner that the voltage level of the reference voltage VREF at the first input terminal of the column amplifier circuit 160_a is equal to the voltage level of voltage VD at the second input terminal of the column amplifier circuit 160_a. Since the second input terminal of the column amplifier circuit 160_a is coupled to the first terminal of the selected DUT 101a, it allows the noise monitoring apparatus 100 to control a bias voltage applied to the first terminal of the selected DUT 101a. More specifically, the bias voltage applied to the first terminal of the selected DUT 101a may be controlled by the column amplifier circuit 160_a (i.e., by controlling the reference voltage VREF). In addition, the control terminal of the selected DUT 101a may be controlled by the bias voltage VG, and the second terminal of the DUT 101a is connected to the ground voltage GND. In some embodiments, the selected DUT 101a includes a transistor have a drain terminal, a gate terminal and a source terminal. The gate terminal is controlled by the bias voltage VG, the drain terminal is controlled by the reference voltage VREF from the column amplifier circuit 160_a, and the source terminal is coupled to the ground voltage GND. In this way, the noise monitoring apparatus 100 may achieve a full-bias control to all terminals of the selected DUTs.

In addition, since the second noise signal $\Delta I_{RTN}$ is generated by subtracting the current signal I2 from the first noise signal I3, the DC component of the first noise signal I3 is canceled out, and only noise signal (i.e., RTN signal) is remained in the second noise signal $\Delta I_{RTN}$. As such, when the second noise signal $\Delta I_{RTN}$ is amplified by the column amplifier circuit 160_a to generate the output value OUTx, the output signal OUTx has a wide dynamic range. In addition, the column amplifier circuit 160_a may be transimpedance amplifier with the wide-dynamic range, for processing signal in the wide-dynamic range.

Referring to FIG. 1 and FIG. 2A, the column DC cancellation circuits 140_1 to 140_m may operate similarly to the operations of the column DC cancellation circuit 140_a. The column amplifier circuits 160_1 to 160_m may operate similarly to operations of the column amplifier circuit 160_a. Thus, the detailed description of the circuit structure and operations of the column DC cancellation circuits 140_1 to 140_m and the column amplifier circuits 160_1 to 160_m is omitted hereafter.

Figure 2B:
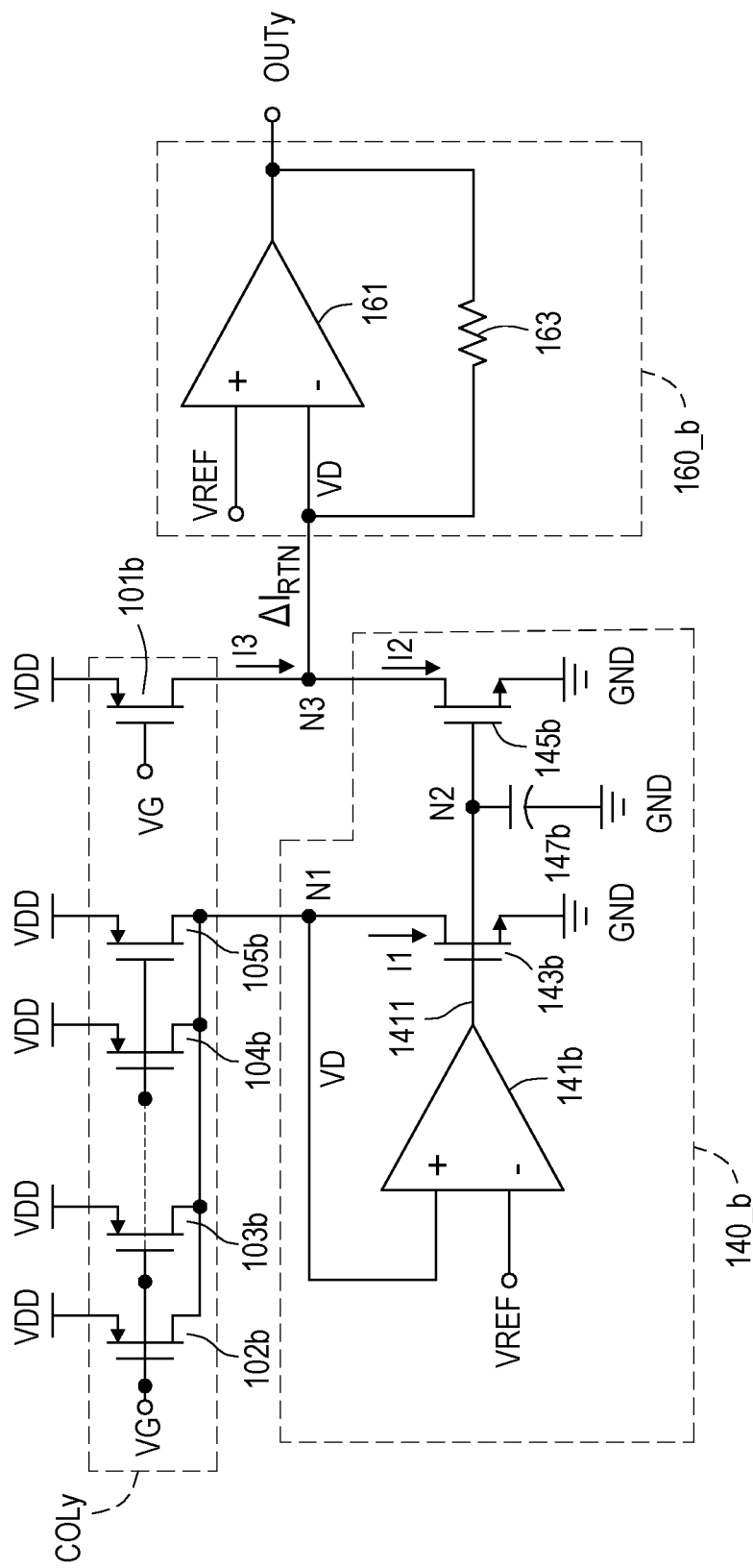

FIG. 2B illustrates a schematic diagram of a column of DUTs COLy, a column DC cancellation circuit 140_b and a column amplifier circuit 160_b in accordance with some embodiments. The column COLy of DUTs may be any one of the columns COL1 to COLm of the DUT array 200 in FIG. 1, and the column DC cancellation circuit 140_b and the column amplifier circuit 160_b correspond to the column COLy.

The column COLy may include a plurality of DUTs 101b to 105b, in which the DUT 101b is the selected DUT and the DUTs 102b to 105b are unselected DUTs. A difference between the DUTs 101b to 105b in FIG. 2B and the DUTs 101a to 105a in FIG. 2A is that each of the DUTs 101b to 105b in FIG. 2B includes a p-type transistor while each of the DUTs 101a to 105a in FIG. 2A includes a n-type transistor. Another difference between the DUTs 101b to 105b in FIG. 2B and the DUTs 101a to 105a in FIG. 2A is the second terminals of the DUTs 101b to 105b in FIG. 2B receive the supply voltage VDD.

The column DC cancellation circuit 140_b includes an amplifier 141b, transistors 143b, 145b and a capacitor 147b. The amplifier 141b and the capacitor 147b of the column DC cancellation circuit 140_b in FIG. 2B are substantially same as the amplifier 141a and the capacitor 147a of column DC cancellation circuit 140_a in FIG. 2A, thus the description of the amplifier 141b and the capacitor 147b is omitted hereafter. A difference between the column DC cancellation circuit 140_b in FIG. 2B and the column DC cancellation circuit 140_a in FIG. 2A is that the transistors 143b, 145b of the column DC cancellation circuit 140_b in FIG. 2B are n-type transistors. The first terminal (i.e., drain terminal) of the transistor 143b is coupled to the connection node N1, the second terminal (i.e., source terminal) of the transistor 143b receives the ground voltage GND and the control terminal (i.e., gate terminal) of the transistor 143b receives the signal 1411 from the amplifier 141b. The output of the amplifier 141b operates in a manner that the voltage VD at the connection node N1 has the same voltage level as the reference voltage VREF. In other words, the amplifier 141b and the transistor 143b may lock the voltage level of the VD to be same as the voltage level of the reference voltage VREF.

The first terminal (i.e., drain terminal) of the transistor 145b is coupled to the connection node N3, the second terminal (i.e., source terminal) of the transistor 145b receives the ground voltage GND, and the control terminal (i.e., gate terminal) of the transistor 145b is coupled to the control terminal of the transistor 143b. The transistors 143b and 145b are configured to mirror the current signal I1 to generate the current signal I2 according to a mirror ratio R. The mirror ratio R is $$\frac{n-1}{1}$$

in some embodiments, in which n is the number of DUTs in each column of the DUT array. In some embodiments, a channel width of the transistor 145b is different from a channel width of the transistor 143b. For example, a ratio of the channel width of the transistor 143b and the channel width of the transistor 145b may be substantially same as the mirror ratio R, but the disclosure is not limited thereto. The current signal I2 is equivalent to an average of the bias current signals from the unselected DUTs 102b to 105b. At the connection node N3, the current signal I2 is subtracted from the first noise signal I3 from the selected DUT 101b to generate the second noise signal $\Delta I_{RTN}$. In some embodiments, the transistors 143b and 145b have comparably large dimension sizes (i.e., width and/or length). The transistors 143b and 145b with large dimension sizes may eliminate any possibility of RTN noise and flicker noise source happened in the DC cancellation circuit 140_b.

The column amplifier circuit 160_b is configured to convert the second noise signal $\Delta I_{RTN}$ to an output voltage (also referred to as an output signal) OUTy according to an amplification gain of the column amplifier circuit 160_b. The column amplifier circuit 160_b in FIG. 2B may have the same circuit structure and operations as the column amplifier circuit 160_a in FIG. 2A, thus the detailed description of the column amplifier circuit 160_b is omitted hereafter.

Figure 3A:
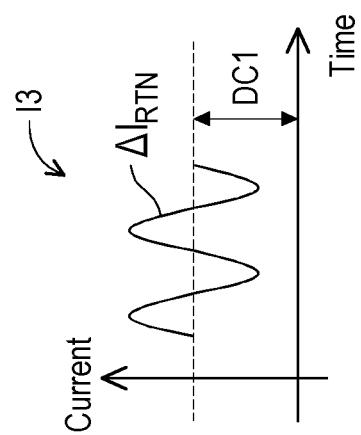
FIG. 3A to FIG. 3C illustrate waveform diagrams of signals in a noise monitoring system in accordance with some embodiments.

FIG. 3A illustrates a waveform diagram of a first noise signal I3 that is measured from a selected DUT (i.e., selected DUT 101a in FIG. 2A or the selected DUT 101b in FIG. 2B) in accordance with some embodiments. The first noise signal I3 may include a DC component DC1 and RTN signal that is represented by the second noise signal $\Delta I_{RTN}$. The DC component DC1 may be canceled out by subtracting the current signal I2 from the first noise signal I3 to generate the second noise signal $\Delta I_{RTN}$.

Figure 3B:
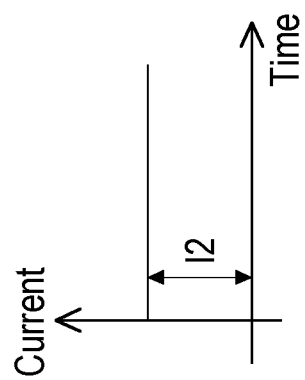

FIG. 3B illustrates a waveform diagram of a current signal I2 in accordance with some embodiments. Referring to FIG. 2A, FIG. 2B and FIG. 3B, the current signal I2 is this obtained based on the bias current signals from unselected DUTs (i.e., unselected DUT 102a to 105a in FIG. 2A or the unselected DUTs 102b to 105b in FIG. 2B). The current signal I2 may be equivalent to an average of the bias current signals from unselected DUTs.

Figure 3C:
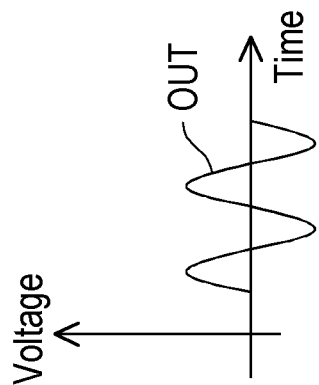

FIG. 3C illustrates a waveform diagram of an output signal OUT (i.e., OUTx in FIG. 2A or OUTy in FIG. 2B) in accordance with some embodiments. The output signal OUT may be generated by converting and amplifying the second noise signal $\Delta I_{RTN}$ with the amplification gain. Referring to FIG. 3A to FIG. 3C, since the DC component of the first noise signal I3 is canceled, only the noise signal (i.e., RTN signal) is converted and amplified to generate the output signal OUT. As a result, the dynamic range of the output signal OUT is wide, and a measurement of the noise signal (i.e., RTN signal) on the selected DUT is improved.

Figure 4:
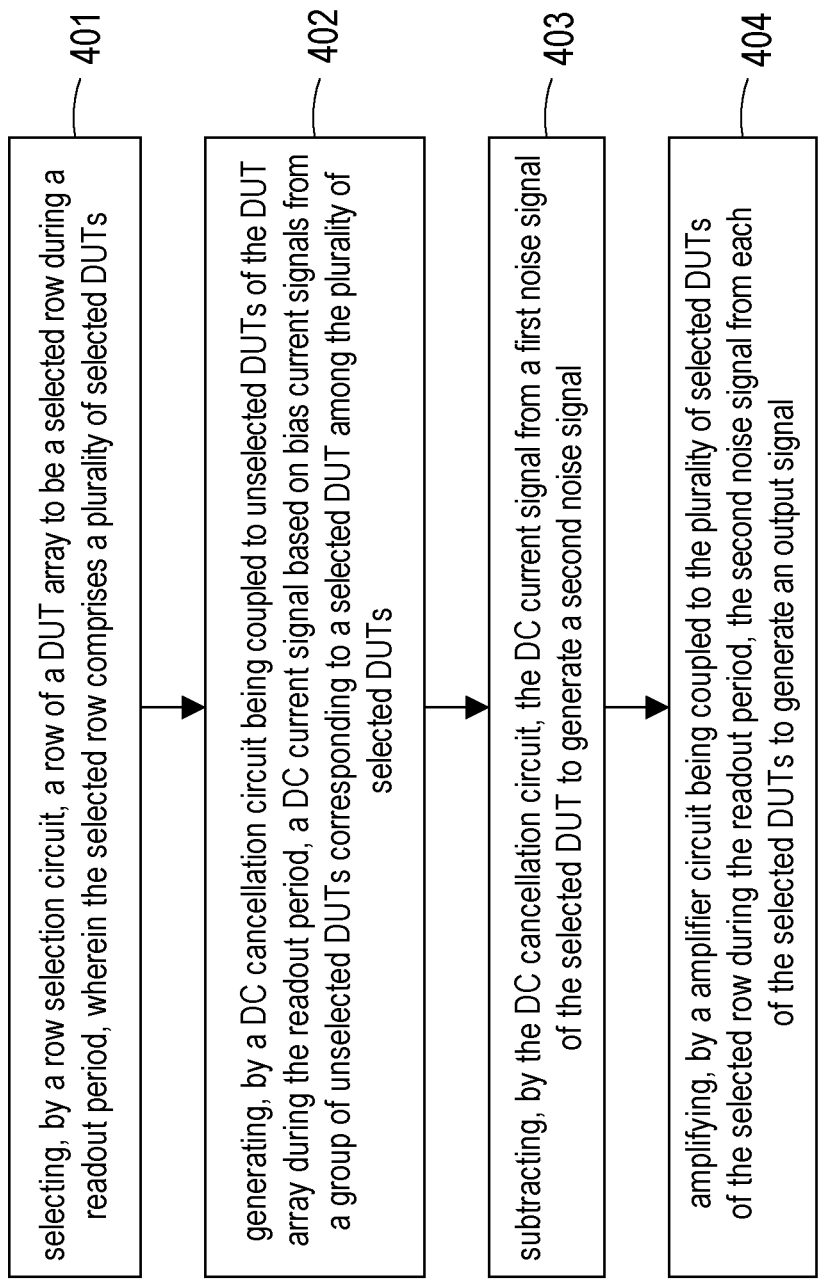
FIG. 4 illustrates a flowchart diagram of a noise monitoring method in accordance with some embodiments.

FIG. 4 illustrates a schematic diagram of a noise monitoring method in accordance with some embodiments. The noise monitoring method may be adapted to a noise monitoring apparatus that includes a row selection circuit, a direct current (DC) cancellation circuit and an amplifier circuit. In block 401, the noise monitoring method selects, by the row selection circuit, a row of a DUT array to be a selected row during a readout period, wherein the selected row includes a plurality of selected DUTs. In block 402, the noise monitoring method generates, by the DC cancellation circuit, a DC current signal based on bias current signals from a group of unselected DUTs corresponding to a selected DUT among the plurality of selected DUTs, wherein the DC cancellation circuit is electrically coupled to unselected DUTs of the DUT array during the readout period In block 403, the noise monitoring method subtracts, by the DC cancellation circuit, the DC current signal from a first noise signal of the selected DUT to generate a second noise signal. In block 403, the noise monitoring method amplifies, by the amplifier circuit, the second noise signal from each of the selected DUTs to generate an output signal, wherein the amplifier circuit is coupled to the plurality of selected DUTs of the selected row during the readout period.

In accordance with some embodiments, a noise monitoring apparatus may include a row selection circuit that selects DUTs of a selected row during a readout period for noise monitoring. In this way, noise signals from all the selected DUTs of the selected row may be monitored in parallel in the same readout period, and efficiency of the noise monitoring apparatus is improved. The noise monitoring apparatus may further include a DC cancellation circuit being electrically coupled to unselected DUTs of the DUT array during the readout period. The DC cancellation circuit may average out bias current signals from the unselected DUTs corresponding to each of the selected DUTs to generate a DC current signal, thereby averaging out random device mismatch of the unselected DUTs and filtering out single DUT noise (i.e., RTN noise). The noise monitoring apparatus may further comprise an amplifier circuit being electrically coupled to the selected DUTs of the DUT array during the readout period. A DC cancellation operation is performed on the first noise signal measured from the each of the selected DUTs by subtracting the noise signal from the DC current signal to generate the second noise signal, thus only the RTN noise is remained in the second noise signal. The second noise signal is amplified by the amplifier circuit to generate the output signal. In this way, the noise monitoring apparatus achieves a wide dynamic range. In addition, a first terminal of each selected DUT is controlled by a reference voltage inputted to the amplifier circuit, a second terminal of each selected DUT receives a supply voltage, and a control terminal of each selected DUT is controlled by a bias voltage. In this way, the noise monitoring apparatus achieves full-bias control on the selected DUTs.

In accordance with some embodiments, a noise monitoring apparatus includes a row selection circuit, a direct current (DC) cancellation circuit and an amplifier circuit. The row selection circuit is configured to select a row of a DUT array to be a selected row during a readout period, wherein the selected row comprises a plurality of selected DUTs. The DC cancellation circuit is coupled to unselected DUTs of the DUT array during the readout period, and is configured to generate a DC current signal based on bias current signals from a group of unselected DUTs corresponding to a selected DUT among the plurality of selected DUTs and subtract the DC current signal from a first noise signal of the selected DUT to generate a second noise signal. The amplifier circuit is coupled to the plurality of selected DUTs of the selected row during the readout period, and is configured to amplify the second noise signal from each of the selected DUTs to generate an output signal.

In accordance with some embodiments, a noise monitoring system includes a device-under-test (DUT) array and a noise monitoring apparatus. The DUT array includes a plurality of rows of DUTs, each of the plurality of rows comprises a plurality of DUTs. The noise monitoring apparatus includes a row selection circuit, a direct current (DC) cancellation circuit and an amplifier circuit. The row selection circuit is configured to select a row of a DUT array to be a selected row during a readout period, wherein the selected row comprises a plurality of selected DUTs. The DC cancellation circuit is coupled to unselected DUTs of the DUT array during the readout period, and is configured to generate a DC current signal based on bias current signals from a group of unselected DUTs corresponding to a selected DUT among the plurality of selected DUTs and subtract the DC current signal from a first noise signal of the selected DUT to generate a second noise signal. The amplifier circuit is coupled to the plurality of selected DUTs of the selected row during the readout period, and is configured to amplify the second noise signal from each of the selected DUTs to generate an output signal.

In accordance with some embodiments, a noise monitoring method of a noise monitoring apparatus is introduced. The noise monitoring apparatus comprises a row selection circuit, a direct current (DC) cancellation circuit and an amplifier circuit. The noise monitoring method comprising steps of selecting, by the row selection circuit, a row of a DUT array to be a selected row during a readout period, wherein the selected row comprises a plurality of selected DUTs; generating, by the DC cancellation circuit being coupled to unselected DUTs of the DUT array during the readout period, a DC current signal based on bias current signals from a group of unselected DUTs corresponding to a selected DUT among the plurality of selected DUTs; subtracting, by the DC cancellation circuit, the DC current signal from a first noise signal of the selected DUT to generate a second noise signal; and amplifying, by the amplifier circuit being coupled to the plurality of selected DUTs of the selected row during the readout period, the second noise signal from each of the selected DUTs to generate an output signal.

The foregoing has outlined features of several embodiments so that those skilled art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A noise monitoring apparatus, comprising:
a row selection circuit, selecting a row of a DUT array to be a selected row during a readout period, wherein the selected row comprises a plurality of selected DUTs;
a direct current (DC) cancellation circuit, coupled to unselected DUTs of the DUT array during the readout period, generating a DC current signal based on bias current signals from a group of unselected DUTs corresponding to a selected DUT among the plurality of selected DUTs, and subtracting the DC current signal from a first noise signal of the selected DUT to generate a second noise signal;
an amplifier circuit, coupled to the plurality of selected DUTs of the selected row during the readout period, amplifying the second noise signal from each of the selected DUTs to generate an output signal.

2. The noise monitoring apparatus of claim 1, wherein the DC cancellation circuit comprises:
a first connection node, electrically coupled to the group of unselected DUTs;
a first amplifier, comprising a first input terminal receiving a reference voltage, a second input terminal being coupled to the first connection node, and an output terminal; and
a first transistor, comprising a control terminal that is electrically coupled to the output terminal of the first amplifier,
wherein the DC cancellation circuit is configured to sum up the bias current signals from the group of unselected DUTs corresponding to the selected DUT to generate a first current signal flowing through the first connection node.

3. The noise monitoring apparatus of claim 2, wherein the DC cancellation circuit further comprises:
a second connection node;
a second transistor, comprising a control terminal that is electrically coupled to a control terminal of the first transistor through the second connection node; and
a low-pass filter, coupled to the second connection node, configured to filter out noise from the first current signal,
wherein DC cancellation circuit is configured to generated the DC current signal based on the first current signal and a mirror ratio.

4. The noise monitoring apparatus of claim 3, wherein the mirror ratio is determined according to a number of the unselected DUTs in the group of unselected DUTs.

5. The noise monitoring apparatus of claim 4, wherein the DC current signal is equivalent to an average of the bias current signals flowing through the unselected DUTs of the group of unselected DUTs.

6. The noise monitoring apparatus of claim 3, further comprising:
a third connection node, coupled between the second transistor of the DC cancellation circuit and the selected DUT, wherein
the noise monitoring apparatus is configured to subtract the DC current signal from the first noise signal of the selected DUT to generate the second noise signal at the third connection node.

7. The noise monitoring apparatus of claim 6, wherein the amplifier circuit comprises:

a second amplifier, comprising a first input terminal receiving the second noise signal from the third connection node, a second input terminal receiving the reference voltage, and an output terminal; and a resistor, coupled between the first input terminal of the second amplifier and the output terminal of the second amplifier, wherein the second amplifier is configured to amplify the second noise signal according an amplification gain to generate the output signal, and the amplification gain is determined according to a resistance of the resistor.

8. The noise monitoring apparatus of claim 6, wherein a voltage inputted to the first input terminal of the second amplifier is equal to the reference voltage inputted to the second input terminal of the second amplifier.

9. The noise monitoring apparatus of claim 8, wherein the selected DUT comprises a selected transistor, a first terminal of the selected transistor is coupled to the third connection node, the first terminal of the selected transistor is controlled by the reference voltage inputted to the second input terminal of the second amplifier of the amplifier circuit, a second terminal of the selected transistor of the selected DUT receives a supply voltage, and a control terminal of the selected transistor is controlled by a biased voltage.

10. The noise monitoring apparatus of claim 9, wherein the first noise signal is a random telegraph noise signal, the amplifier circuit is a transimpedance amplifier circuit, each DUT of the DUT array comprises a control terminal, and the control terminal of each DUT of the DUT array is biased by the bias voltage.

11. A noise monitoring system, comprising:

a device-under-test (DUT) array, comprising a plurality of rows of DUTs, each of the plurality of rows comprises a plurality of DUTs; and a noise monitoring apparatus, comprising:

a row selection circuit, selecting a row of the DUT array to be a selected row during a readout period, wherein the selected row comprises a plurality of selected DUTs a direct current (DC) cancellation circuit, coupled to unselected DUTs of the DUT array during the readout period, generating a DC current signal based on bias current signals from a group of unselected DUTs corresponding to a selected DUT among the plurality of selected DUTs, and subtracting the DC current signal from a first noise signal of the selected DUT to generate a second noise signal; and an amplifier circuit, coupled to the plurality of selected DUTs of the selected row during the readout period, amplifying the second noise signal from each of the selected DUTs to generate an output signal.

12. The noise monitoring apparatus of claim 11, wherein the DC cancellation circuit comprises:

a first connection node, electrically coupled to the group of unselected DUTs;

a first amplifier, comprising a first input terminal receiving a reference voltage, a second input terminal being coupled to the first connection node, and an output terminal; and a first transistor, comprising a control terminal that is electrically coupled to the output terminal of the first amplifier, wherein the DC cancellation circuit is configured to sum up the bias current signals from the group of unselected DUTs corresponding to the selected DUT to generate a first current signal flowing through the first connection node.

13. The noise monitoring apparatus of claim 12, wherein the DC cancellation circuit further comprises:

a second connection node;

a second transistor, comprising a control terminal that is electrically coupled to a control terminal of the first transistor through the second connection node; and a low-pass filter, coupled to the second connection node, configured to filter out noise from the first current signal, wherein DC cancellation circuit is configured to generated the DC current signal based on the first current signal and a mirror ratio, and the DC current signal is equivalent to an average of the bias current signals flowing through the unselected DUTs of the group of unselected DUTs.

14. The noise monitoring system of claim 13, wherein the mirror ratio is determined according to a number of the unselected DUTs in the group of unselected DUTs.

15. The noise monitoring system of claim 13, wherein the noise monitoring apparatus further comprises:

a third connection node, coupled between the second transistor of the DC cancellation circuit and the selected DUT, wherein the noise monitoring apparatus is configured to subtract the DC current signal from the first noise signal of the selected DUT to generate the second noise signal at the third connection node.

16. The noise monitoring system of claim 15, wherein the amplifier circuit comprises:

a second amplifier, comprising a first input terminal receiving the second noise signal from the third connection node, a second input terminal receiving the reference voltage, and an output terminal; and a resistor, coupled between the first input terminal of the second amplifier and the output terminal of the second amplifier, wherein the second amplifier is configured to amplify the second noise signal according an amplification gain to generate the output signal, and the amplification gain is determined according to a resistance of the resistor.

17. The noise monitoring system of claim 16, wherein a voltage inputted to the first input terminal of the second amplifier is equal to the reference voltage inputted to the second input terminal of the second amplifier.

18. The noise monitoring system of claim 17, wherein the selected DUT comprises a selected transistor, a first terminal of the selected transistor is coupled to the third connection node, the first terminal of the selected transistor is controlled by the reference voltage inputted to the second input terminal of the second amplifier of the amplifier circuit, a second terminal of the selected transistor of the selected DUT receives a supply voltage, and a control terminal of the selected transistor is controlled by a biased voltage.

19. The noise monitoring system of claim 11, wherein the first noise signal is a random telegraph noise signal, the amplifier circuit is a transimpedance amplifier circuit, each DUT of the DUT array comprises a control terminal, and the control terminal of each DUT of the DUT array is biased by the bias voltage.

20. A noise monitoring method of a noise monitoring apparatus, the noise monitoring apparatus comprises a row selection circuit, a direct current (DC) cancellation circuit and an amplifier circuit, the noise monitoring method comprising:
- selecting, by the row selection circuit, a row of a DUT array to be a selected row during a readout period, wherein the selected row comprises a plurality of selected DUTs;
- generating, by the DC cancellation circuit being coupled to unselected DUTs of the DUT array during the readout period, a DC current signal based on bias current signals from a group of unselected DUTs corresponding to a selected DUT among the plurality of selected DUTs;
- subtracting, by the DC cancellation circuit, the DC current signal from a first noise signal of the selected DUT to generate a second noise signal; and
- amplifying, by the amplifier circuit being coupled to the plurality of selected DUTs of the selected row during the readout period, the second noise signal from each of the selected DUTs to generate an output signal.

* * * * *